United States Patent
Oh et al.

(10) Patent No.: US 11,328,786 B2
(45) Date of Patent: May 10, 2022

(54) MEMORY MODULE STORING TEST PATTERN INFORMATION, COMPUTER SYSTEM COMPRISING THE SAME, AND TEST METHOD THEREOF

(71) Applicant: Samsung Electronics Co., Ltd., Suwon-si (KR)

(72) Inventors: Jihyuk Oh, Suwon-si (KR); Jiseok Kang, Hwaseong-si (KR); Junho Jung, Seongnam-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 205 days.

(21) Appl. No.: 16/781,184

(22) Filed: Feb. 4, 2020

(65) Prior Publication Data

US 2021/0020258 A1    Jan. 21, 2021

(30) Foreign Application Priority Data

Jul. 15, 2019  (KR) .................. 10-2019-0085208

(51) Int. Cl.
*G11C 29/10*  (2006.01)
*G06F 13/16*  (2006.01)

(52) U.S. Cl.
CPC .......... *G11C 29/10* (2013.01); *G06F 13/1668* (2013.01)

(58) Field of Classification Search
CPC . G11C 29/10; G11C 2029/3602; G11C 29/06; G11C 29/56004; G11C 5/04; G11C 29/36; G06F 13/1668; G06F 11/27; G06F 11/2284; G06F 11/263
See application file for complete search history.

(56) References Cited

U.S. PATENT DOCUMENTS

| | | | |
|---|---|---|---|
| 6,802,034 B2 | 10/2004 | Matsuo et al. | |
| 6,910,162 B2 | 6/2005 | Co et al. | |
| 8,607,104 B2 | 12/2013 | Cho et al. | |
| 8,621,292 B2* | 12/2013 | Kim ................ | G11C 29/56004 714/718 |
| 2003/0074153 A1* | 4/2003 | Sugamori ............ | G11C 29/56 702/122 |
| 2007/0050167 A1* | 3/2007 | Johnson ............ | G01R 31/31716 702/117 |
| 2012/0029861 A1* | 2/2012 | Mando ............. | G11C 29/56004 702/117 |
| 2019/0162782 A1* | 5/2019 | Shanbhogue ...... | G01R 31/3187 |
| 2021/0166778 A1* | 6/2021 | Guo ................. | G11C 29/56004 |
| 2021/0265003 A1* | 8/2021 | Lee ........................ | G11C 29/36 |

FOREIGN PATENT DOCUMENTS

| | | |
|---|---|---|
| JP | 20010155497 A | 6/2001 |
| JP | 20020222600 A | 8/2002 |
| JP | 4011321 B2 | 11/2007 |
| KR | 100825068 B1 | 4/2008 |

* cited by examiner

*Primary Examiner* — Cynthia Britt

(74) *Attorney, Agent, or Firm* — Harness, Dickey & Pierce, P.L.C.

(57) ABSTRACT

A memory module includes at least one semiconductor memory device, and a test pattern memory that stores first test pattern information for testing the at least one semiconductor memory device, and the first test pattern information stored in the test pattern memory is transferred to a host in a test operation. Through the memory module having the above-described function, a memory test is possible in consideration of a unique weak characteristic of the memory module.

20 Claims, 13 Drawing Sheets

Test Pattern Parameter (TPP)

| Byte | Define | Data |
|---|---|---|
| 00 | Pattern No. | 1 |
| 01 | Data No. | 2 |
| 02 | Aggressor | 0 |
| 03 | Victim start(-) | -4 |
| 04 | Victim end(-) | -1 |
| 05 | Victim start(+) | 1 |
| 06 | Victim end(+) | 4 |
| 07 | Write X start | -4 |
| 08 | Write X end | -1 |
| 09 | Write Y start | 0 |
| 10 | Write Y end | Max |
| 11 | Write data | 1 |
| ⋮ | ⋮ | ⋮ |

MEMORY MODULE STORING TEST PATTERN INFORMATION, COMPUTER SYSTEM COMPRISING THE SAME, AND TEST METHOD THEREOF

CROSS-REFERENCE TO RELATED APPLICATIONS

This application claims priority under 35 U.S.C. § 119 to Korean Patent Application No. 10-2019-0085208 filed on Jul. 15, 2019, in the Korean Intellectual Property Office, the disclosures of which are incorporated by reference herein in their entireties.

BACKGROUND

Example embodiments of the inventive concepts described herein relate to a semiconductor memory device. For example, at least some example embodiments relate to a memory module storing test pattern information, a computer system including the same, and/or a test method thereof.

A semiconductor memory device may be classified as a volatile memory device, in which stored data disappears when a power is turned off, such as a static random access memory (SRAM) or a dynamic random access memory (DRAM), or a nonvolatile memory device, in which stored data is retained even when a power is turned off, such as a flash memory device, a phase-change RAM (PRAM), a magnetic RAM (MRAM), a resistive RAM (RRAM), or a ferroelectric RAM (FRAM).

The DRAM is being used as a main memory in various systems, such as a mobile device and a server, as well as a personal computer. With the demand on high integration and high capacity, the DRAM is being manufactured through a nano-scale manufacturing technology. As such, a test operation that is performed in the process of manufacturing the DRAM becomes gradually complicated. In addition, even though the DRAM passes the test operation performed during manufacturing, a defect may occur thereafter while the DRAM is supplied to any other manufacturer. The number of defective products occurring after the test operation is increasing as the DRAM is manufactured through the nano-scale manufacturing technology.

SUMMARY

Example embodiments of the inventive concepts provide a memory module storing test pattern information so as to make a DRAM characteristic-based test possible, a computer system including the same, and/or a test method thereof.

According to an example embodiment, a memory module includes at least one semiconductor memory device; and a test pattern memory configured to, store first test pattern information for testing the at least one semiconductor memory device, and transfer the first test pattern information to a host in a test operation.

According to an example embodiment, a method of testing a memory module includes reading a test pattern parameter stored in the memory module; generating a test pattern based on the test pattern parameter read from the memory module; and testing the memory module based on the test pattern.

According to an example embodiment, a computer system includes a memory module including at least one semiconductor memory device and a test pattern memory, the test pattern memory configured to store a test pattern parameter including weak information associated with the at least one semiconductor memory device; and a host device configured to generate a test pattern based on the test pattern parameter read from the memory module, the test pattern for testing the memory module.

BRIEF DESCRIPTION OF THE FIGURES

The above and other objects and features of the inventive concepts will become apparent by describing in detail some example embodiments thereof with reference to the accompanying drawings.

DETAILED DESCRIPTION

Below, a DRAM device and a DRAM module may be used as an example of a semiconductor memory device for describing features and functions of the inventive concepts. However, one skilled in the art may easily understand other merits and performance of the inventive concepts depending on the contents disclosed here. The inventive concepts may be implemented or applied through other example embodiments. In addition, the detailed description may be changed or modified according to view points and applications without departing from the claims, the scope and spirit, and any other purposes of the inventive concepts.

Below, some example embodiments of the inventive concepts may be described in detail and clearly to such an extent that an ordinary one in the art easily implements the inventive concepts.

Figure 1:
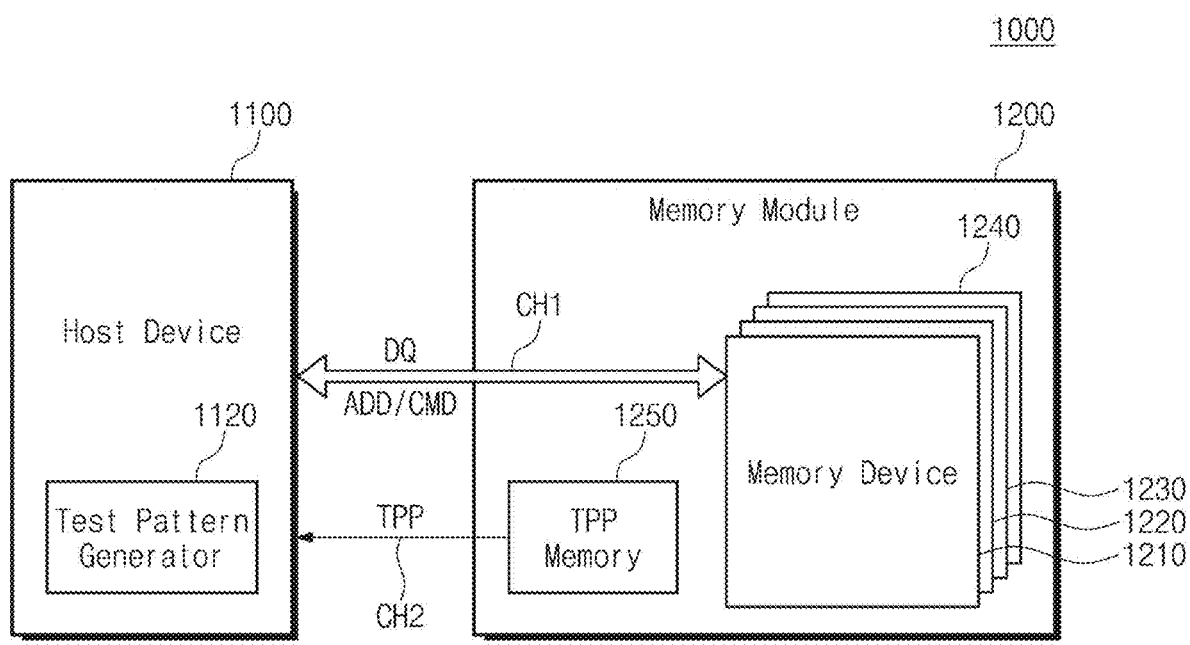
FIG. 1 is a block diagram illustrating a computer system according to an example embodiment of the inventive concepts.

FIG. 1 is a block diagram illustrating a computer system according to an example embodiment of the inventive concepts.

Referring to FIG. 1, a computer system 1000 may be one of a desktop computer, a laptop computer, a tablet computer, a smartphone, a wearable device, a server, an electric vehicle, home applications, etc.

The computer system 1000 may be roughly divided into a host device 1100 and a memory module 1200.

The host device 1100 may perform various arithmetic/logical operations for the purpose of controlling overall operations of the computer system 1000. In particular, the host device 1100 may include a test pattern generator 1120. The test pattern generator 1120 generates a test pattern TP by using a test pattern parameter TPP provided from the memory module 1200.

The test pattern TP may be defined as a command, an address, and/or a data set for various test operations to be performed on the memory module 1200. For example, to perform a stress test operation on a certain memory cell, a command CMD, an address ADD, and data DQ are generated as the test pattern TP to apply a stress to the certain memory cell. The test pattern generator 1120 generates the test pattern TP by using the test pattern parameter TPP to which a weak characteristic of the memory module 1200 is applied. The host device 1100 may test the memory module 1200 by using the test pattern TP thus generated. The memory module 1200 may be tested at a BIOS level and/or an operating system (OS) level of the host device 1100.

In addition, although not illustrated in FIG. 1, the host device 1100 may include components such as a central processing unit (CPU), a graphics processing unit (GPU), and a network interface card (NIC). Alternatively, the host device 1100 may be a device, which includes one or more processor cores, such as a general-purpose CPU, a dedicated application specific integrated circuit (ASIC), or an application processor.

The memory module 1200 is provided as a main memory for an operation of the computer system 1000. The memory module 1200 may include, for example, a DRAM module such as a dual in-line memory module (DIMM). The memory module 1200 may be tested by the host device 1100 during a booting operation or any other operation. A plurality of memory devices 1210 to 1240 may be mounted on a printed circuit board.

The memory module 1200 includes a test pattern memory 1250 including a nonvolatile memory element and the plurality of memory devices 1210 to 1240. The test pattern parameter TPP of the memory module 1200 is stored in the test pattern memory 1250. The test pattern parameter TPP is provided to the test pattern generator 1120 of the host device 1100, and thus, the test pattern TP for testing the memory module 1200 is generated. The test pattern TP may be provided to the memory module 1200 in the form of a command, an address, data, or a combination thereof.

Here, the test pattern parameter TPP stored in the test pattern memory 1250 may be a parameter including characteristic information for each generation, for each capacity, and for each kind of the memory module 1200. In general, a weak characteristic of the memory module 1200 may vary depending on a manufactured time, a capacity, and a kind. The test pattern parameter TPP may be generated by using data based on a unique weak characteristic of the memory module 1200 and may be programmed in the test pattern memory 1250 at a manufacturing level.

When the computer system 1000 is booted up or is initialized, the host device 1100 performs test and initialization operations on the memory module 1200. In this case, for the test operation, the host device 1100 may access the test pattern memory 1250 to fetch the test pattern parameter TPP. The test pattern generator 1120 generates the test pattern TP for testing the memory module 1200, by using the test pattern parameter TPP. Depending on the generated test pattern TP, the host device 1100 may generate the command CMD, the address ADD, and the data DQ for testing the memory module 1200 and may write or read data in or from the plurality of memory devices 1210 to 1240.

Here, there may be used a side band channel CH2, not a data channel CH1, to transfer the test pattern parameter TPP from the test pattern memory 1250 to the host device 1100. For example, the side band channel CH2 may include at least one of an Inter-Integrated Circuit $I^2C$ interface, a system management bus (SMBus) interface, a universal asynchronous receiver transmitter (UART) interface, a serial peripheral interface (SPI), and a high-speed inter-chip (HSIC) interface. The side band channel CH2 may be a bidirectional channel for out of band communication between the host device 1100 and the memory module 1200 or the sideband channel may include, for example, the out-of-band bus and/or address, control and/or commands.

The way to embed and provide the test pattern parameter TPP, to which a weak characteristic of the memory module 1200 is applied, in the memory module 1200 is described above. The host device 1100 may generate a test pattern based on the test pattern parameter TPP read from the memory module 1200, where the test pattern parameter has a weak characteristic of the memory module 1200 applied thereto and may test the memory module 1200 by using the test pattern. Accordingly, it may be possible to construct a test environment customized (or, alternatively, improved or optimized) for the memory module 1200, and it may be possible to reduce an unnecessary test procedure.

Figure 2A:
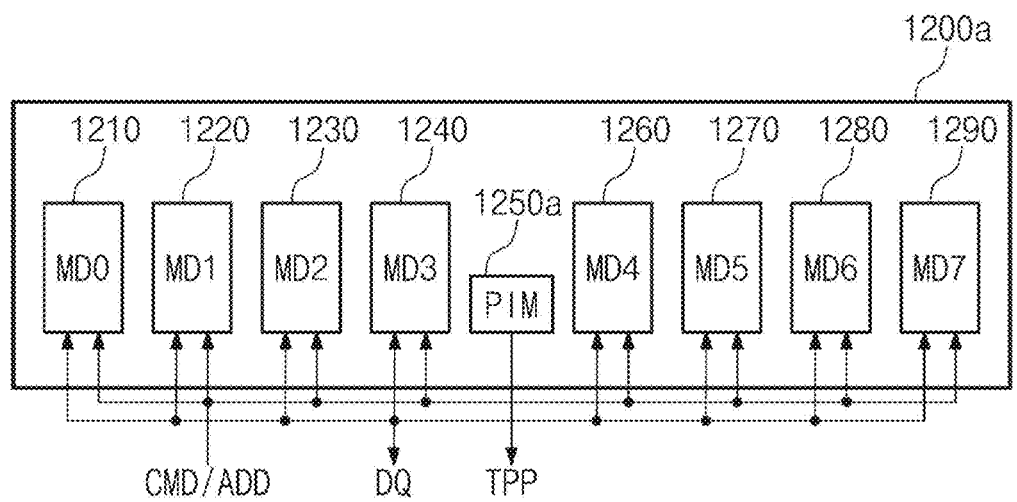
FIGS. 2A to 2C are block diagrams illustrating examples of a memory module of the inventive concepts.
Figure 2B:
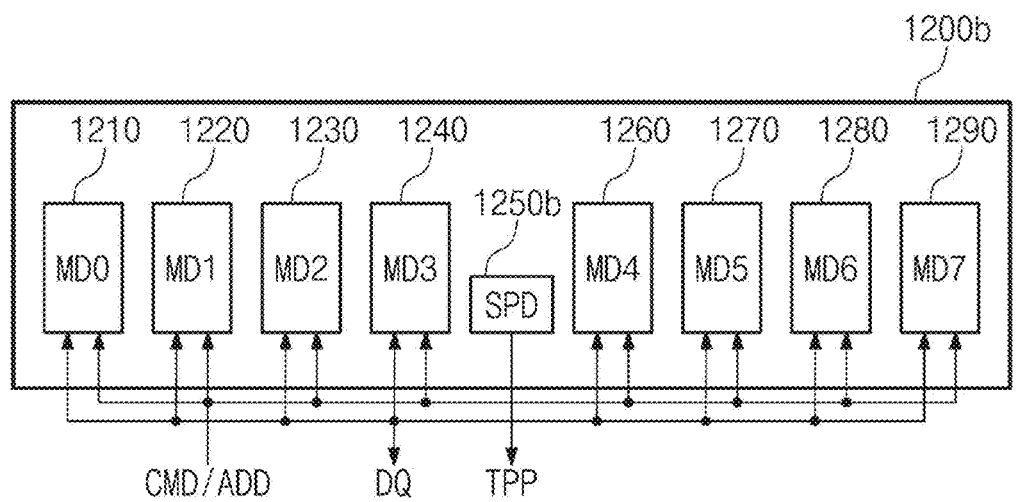
Figure 2C:
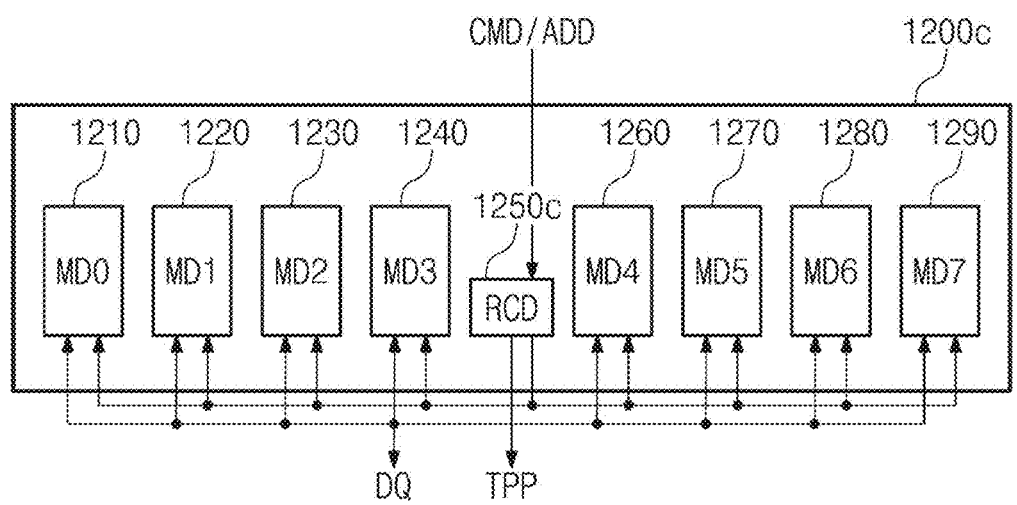

FIGS. 2A to 2C are block diagrams illustrating examples of a memory module providing a test pattern parameter of the inventive concepts.

Referring to FIG. 2A, a memory module 1200*a* according to an example embodiment may include a plurality of memory devices 1210 to 1240 and 1260 to 1290 and a parameter information memory (PIM) 1250*a*. The plurality of memory devices 1210 to 1240 and 1260 to 1290 may store or output data in response to the command CMD, the address ADD, and the data DQ provided from the host device 1100. When the test operation is performed by the host device 1100, the command CMD, the address ADD, and the data DQ corresponding to the test pattern TP may be provided to the plurality of memory devices 1210 to 1240 and 1260 to 1290. As the test operation is performed, the plurality of memory devices 1210 to 1240 and 1260 to 1290 may write data or may output the written data to the outside.

The parameter information memory 1250*a* may be provided as the test pattern memory 1250 of FIG. 1. The parameter information memory 1250*a* may store the test pattern parameter TPP and may provide the test pattern parameter TPP to the host device 1100. The parameter information memory 1250*a* may be implemented with a dedicated nonvolatile memory or EEPROM for storing the test pattern parameter TPP.

The test pattern parameter TPP may be programmed in the parameter information memory 1250 *a* in the process of manufacturing the memory module 1200. In a mounting environment, the test pattern parameter TPP stored in the parameter information memory 1250 *a* may be read by the BIOS or operating system OS during a booting operation or any other operation. The test pattern parameter TPP may be used for the test pattern generator 1120 (refer to FIG. 1) to generate the test pattern TP. The parameter information memory 1250 *a* may include, for example, at least one of a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), a ferroelectric RAM (FRAM), etc.

Referring to FIG. 2B, a memory module 1200b according to another example embodiment may include the plurality of memory devices 1210 to 1240 and 1260 to 1290 and a serial component recognition device (hereinafter referred to as an "SPD") 1250b storing the test pattern parameter TPP. The plurality of memory devices 1210 to 1240 and 1260 to 1290 are substantially the same as those of FIG. 2A, and thus, additional description will be omitted to avoid redundancy. The SPD 1250b stores SPD information read in a booting operation and the test pattern parameter TPP of the inventive concepts. In general, the SPD information includes, but is not limited to, a size, a capacity, a driving speed, a driving voltage, chip layout information, and a module ID of the memory module 1200.

In particular, the test pattern parameter TPP may be programmed in the SPD 1250b of the inventive concepts in the process of manufacturing the memory module 1200. The test pattern parameter TPP of the inventive concepts may be provided in units of hundreds bytes to hundreds megabytes. Accordingly, an expanded memory area capable of storing the test pattern parameter TPP of the inventive concepts may be included in the SPD 1250b. When the computer system 1000 is booted up, the test pattern parameter TPP may be read by the BIOS, and the test pattern generator 1120 may generate the test pattern TP based on the test pattern parameter TPP.

Referring to FIG. 2C, a memory module 1200c according to another example embodiment may include the plurality of memory devices 1210 to 1240 and 1260 to 1290 and a register clock driver (hereinafter referred to as an "RCD") 1250c storing the test pattern parameter TPP. The plurality of memory devices 1210 to 1240 and 1260 to 1290 are substantially the same as those of FIG. 2A, and thus, additional description will be omitted to avoid redundancy.

The RCD 1250c may receive a command, an address, or a control signal from the host device 1100 and may transfer the command, the address, or the control signal to the plurality of memory devices 1210 to 1240 and 1260 to 1290. The plurality of memory devices 1210 to 1240 and 1260 to 1290 may perform the data exchange with the host device 1100 in response to the command, the address, or the control signal provided from the RCD 1250c.

The RCD 1250c may store the test pattern parameter TPP of the inventive concepts. The test pattern parameter TPP may be programmed in the RCD 1250c of the inventive concepts in the process of manufacturing the memory module 1200. When the computer system 1000 is booted up, the test pattern parameter TPP may be read by the BIOS, and the test pattern generator 1120 may generate the test pattern TP based on the test pattern parameter TPP. An expanded memory capacity may be provided in the RCD 1250c for the purpose of programming the test pattern parameter TPP.

Examples of the memory module 1200 capable of storing the test pattern parameter TPP of the inventive concepts are described above. However, in the case where the plurality of memory devices 1210 to 1240 and 1260 to 1290 are implemented with a nonvolatile memory, it may be well understood that the test pattern parameter TPP may be stored in at least one of the plurality of memory devices 1210 to 1240 and 1260 to 1290.

Figure 3:
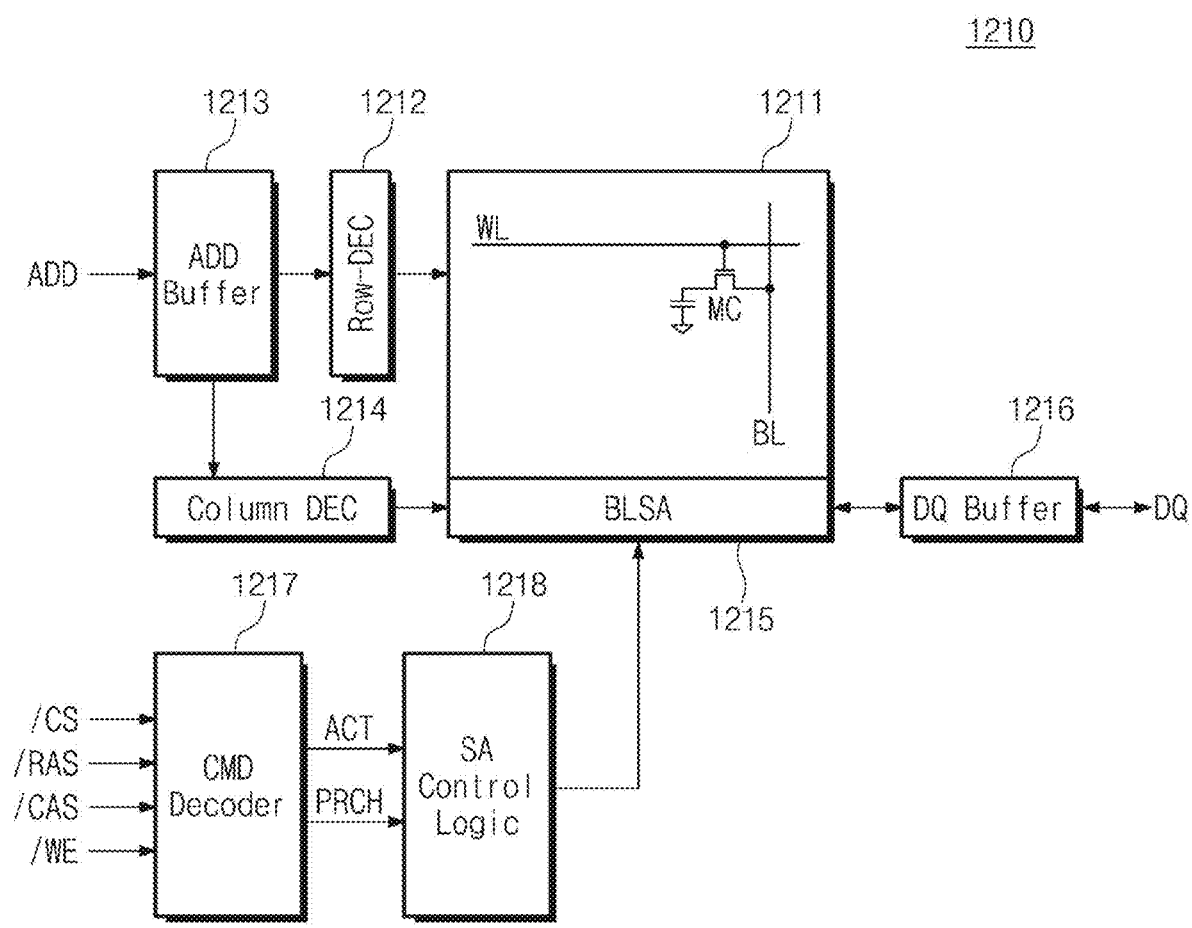
FIG. 3 is a block diagram briefly illustrating one of a plurality of memory devices of FIG. 1.

FIG. 3 is a block diagram illustrating one of a plurality of memory devices of FIG. 1.

Referring to FIG. 3, a memory device 1210 may include a cell array 1211, a row decoder 1212, an address buffer 1213, a column decoder 1214, a bit line sense amplifier 1215, a data input/output (DQ) buffer 1216, a command decoder 1217, and sense amplifier control logic 1218.

The cell array 1211 includes a plurality of memory cells MC that are connected with word lines and bit lines and are arranged in a row direction and a column direction. Each of the memory cells MC may include a cell capacitor and an access transistor. In each of the memory cells MC, a gate of the access transistor is connected to one of the word lines arranged in the row direction. A first end of the access transistor is connected to a bit line BL or a complementary bit line (BLB) extending in the column direction. A second end of the access transistor is connected to the cell capacitor. The cell capacitor may store charges, the amount of which is determined depending on data to be stored. The cell capacitor may be refreshed to maintain the amount of charges corresponding to the stored data.

The row decoder 1212 selects a word line of a memory cell to be accessed, in response to an input address ADD. The row decoder 1212 decodes the input address ADD and enables a word line corresponding to the decoded address. Also, in a self-refresh mode of operation, the row decoder 1212 may decode a row address generated from an address counter (not illustrated) and may enable a word line corresponding to the decoded address. The column decoder 1214 selects a bit line of a memory cell targeted for a read operation or a write operation.

The address buffer 1213 temporarily stores the address ADD input from the outside. The address buffer 1213 provides the stored address ADD to the row decoder 1212 or the column decoder 1214. The address ADD of an external signaling manner may be converted to an internal signaling manner of the memory device 1210 by the address buffer 1213.

The bit line sense amplifier 1215 may write data in a memory cell through a selected bit line. The bit line sense amplifier 1215 may sense data stored in a selected memory cell and may provide the sensed data to the DQ buffer 1216. Also, the bit line sense amplifier 1215 may further include components for storing input data in a selected memory cell. Alternatively, the bit line sense amplifier 1215 may perform an operation (e.g., a rewrite operation) of reading data stored in a memory cell and writing the read data back to the memory cell, in the self-refresh mode.

The DQ buffer 1216 temporarily stores write data input from the outside and provides the write data to the bit line sense amplifier 1215. The DQ buffer 1216 outputs sensed data provided from the bit line sense amplifier 1215 to the outside. The DQ buffer 1216 may provide data to the bit line sense amplifier 1215 and may output data sensed by the bit line sense amplifier 1215 to the outside.

The command decoder 1217 determines an input command with reference to signals /CS, /RAS, /CAS, and /WE applied from the outside. In a general DRAM, an active command and an auto refresh command are determined by a combination of the signals /CS, /RAS, /CAS, and /WE. Also, a self-refresh command may be identified by a combination of the auto refresh command and a clock enable signal CKE. The command decoder 1217 may decode the active command and a precharge command and may provide an active signal ACT or a precharge signal PRCH to the sense amplifier control logic 1218.

The sense amplifier control logic 1218 controls the bit line sense amplifier 1215 under control of the command decoder 1217. In particular, the sense amplifier control logic 1218 may allow the bit line sense amplifier 1215 to write and sense data.

The memory device 1210 of the inventive concepts that is implemented with a DRAM is briefly described above, but the memory device 1210 of the inventive concepts is not limited to the above configuration.

Figure 4:
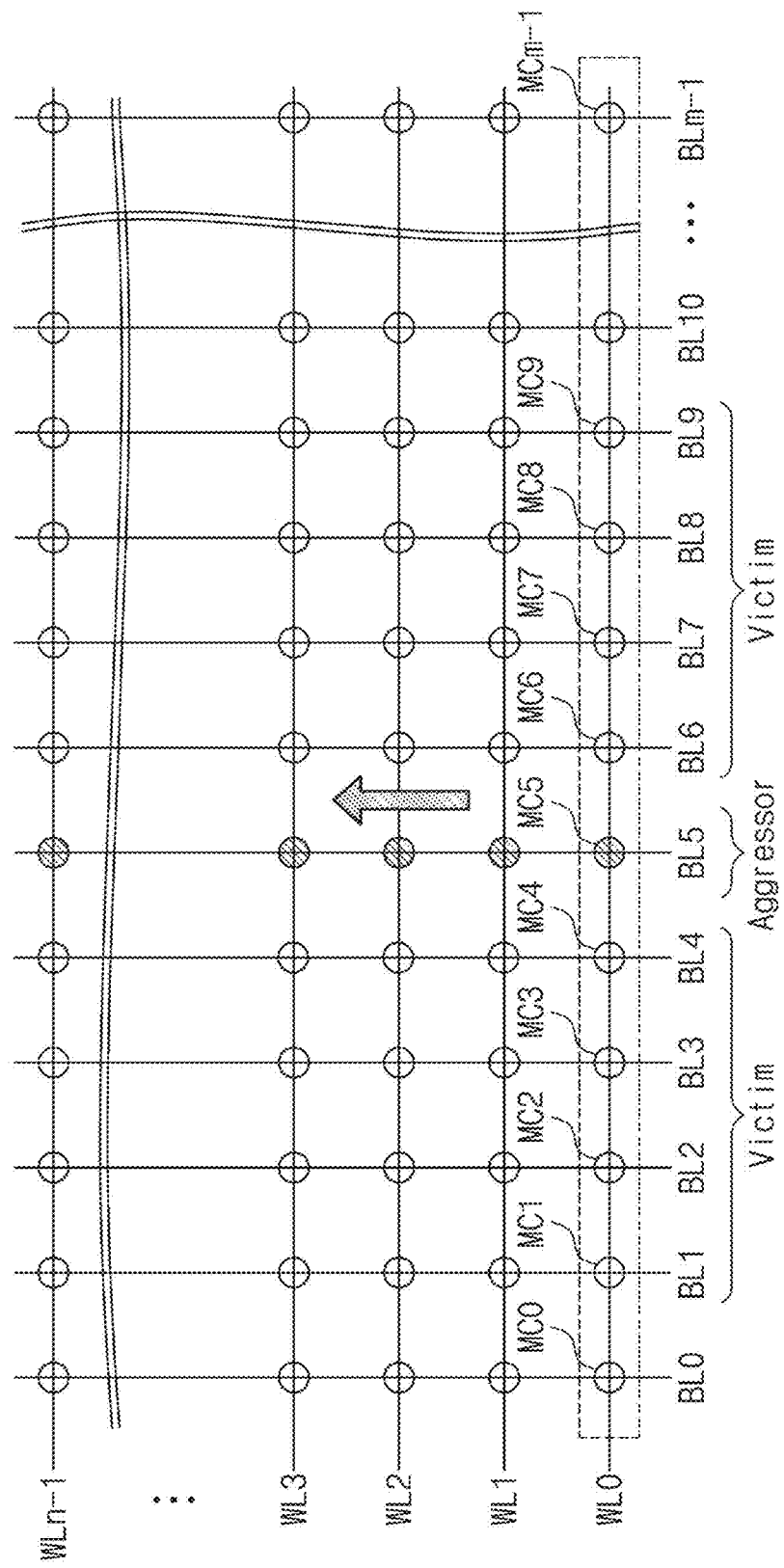
FIG. 4 is a diagram illustrating an example of a method of testing a cell array of FIG. 3.

FIG. 4 is a diagram illustrating an example of a method of testing a cell array of FIG. 3.

Referring to FIG. 4, memory cells of the cell array 1211 (refer to FIG. 3) may be tested by using the test pattern TP that is generated by the test pattern generator 1120 of the host device 1100. A stress test associated with certain memory cells will be described as an example of testing memory cells of the cell array 1211. However, it may be well understood that a kind or a method of a memory test is not limited to the above example.

First, rows WLi may be sequentially selected for a test operation. Data may be written while columns BLj are sequentially selected with a row WLi selected. Due to the written data, a certain memory cell may be allocated as an aggressor, and any other memory cell may be allocated as a victim. For example, in each of the rows WL0 to WLn_1, memory cells in a selected column BL5 may be allocated as an aggressor, and memory cells in surrounding columns BL1 to BL4 and BL6 and BL9 of the selected column BL5 may be allocated as a victim. This allocation may be shifted sequentially in the row direction and the column direction.

For example, when the word line WL0 is selected for the test operation, some of memory cells MC0 to MCm−1 connected to the word line WL0 may be allocated to an aggressor, and the remaining memory cells of the memory cells MC0 to MCm−1 other than the memory cells allocated to the aggressor may be allocated to a victim. For example, when the memory cell MC5 connected to a bit line BL5 is allocated to an aggressor, surrounding memory cells MC1 to MC4 and MC6 to MC9 may be allocated to a victim. An example in which one of memory cells in a selected row is allocated to an aggressor is described above. If necessary, two or more aggressors may be allocated. For example, logic "1" may be written in a memory cell corresponding to an aggressor, and logic "0" may be written in a memory cell corresponding to a victim. Whether memory cells corresponding to a victim operate normally may be determined by performing a read operation on the memory cells corresponding to the victim. All the memory cells of the cell array 1211 may be allocated to an aggressor and a victim while the above allocation is shifted in the row direction and the column direction.

Here, a description is given as a row and a column correspond to a word line and a bit line, respectively, but it may be well understood that a row and a column may correspond to a bit line and a word line, respectively.

Figures 5, 6:
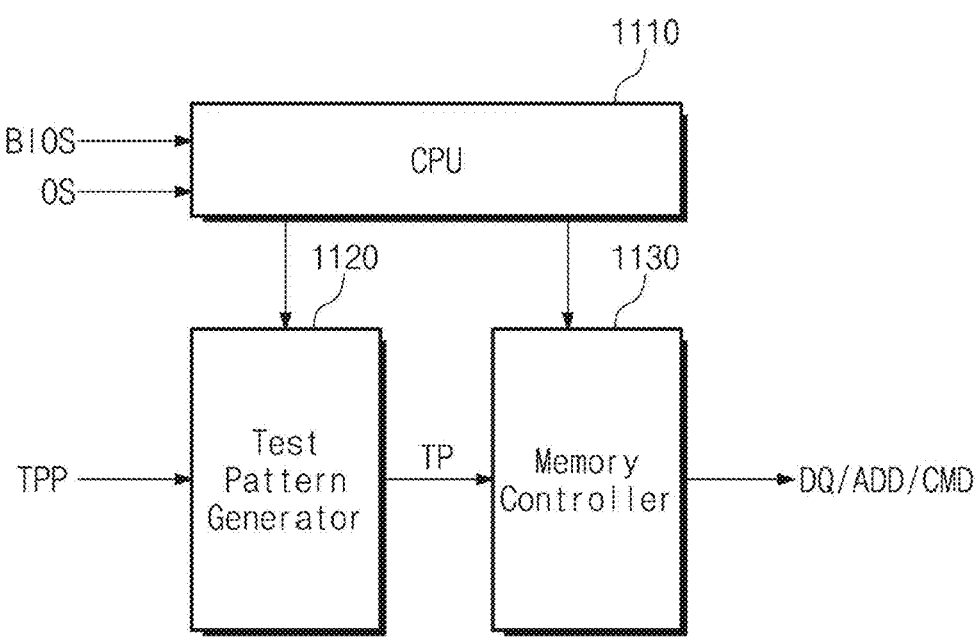
FIG. 5 is a table illustrating the test pattern parameter TPP for performing a stress test performed in FIG. 4.
FIG. 6 is a block diagram illustrating a method in which a host device generates the test pattern TP, according to an example embodiment of the inventive concepts.

FIG. 5 is a table illustrating the test pattern parameter TPP for performing a stress test performed in FIG. 4.

Referring to FIG. 5, the test pattern parameter TPP may include various parameters for generating the test pattern TP, and each parameter may be in units of bytes.

First, a pattern number may be allocated to Byte 00. A data number corresponding to a pattern may be defined by using Byte 01. The data number may be, for example, a value indicating one of kinds of data patterns for applying a stress. A value indicating a position of an aggressor in a selected column (or bit line) may be allocated to Byte 02. For example, when the bit line BL5 is selected in FIG. 4, a memory cell connected to the bit line BL5 is designated as an aggressor.

Values indicating positions of victims placed on the left of the selected column (or bit line) may be allocated to Byte 03 and Byte 04. That is, when the bit line BL5 is selected in FIG. 4, memory cells connected to the bit lines BL1 to BL4 are designated as a victim. Values indicating positions of victims placed on the right of the selected column (or bit line) may be allocated to Byte 05 and Byte 06. That is, when the bit line BL5 is selected in FIG. 4, memory cells connected to the bit lines BL6 to BL9 are designated as a victim.

Cells where data are to be written through a selected column (or bit line) are defined by using Byte 7 and Byte 8. That is, when the bit line BL5 is selected in FIG. 4, data are written in memory cells connected to the bit lines BL1 to BL4, and a test operation is performed. A range of rows targeted for a test operation is defined by using Byte 09 and Byte 10. A data value to be written in a memory cell selected as a victim or an aggressor may be defined by using Byte 11.

The test pattern parameter TPP described with reference to the table of FIG. 5 is only a portion of the test pattern parameter TPP of the inventive concepts. The test pattern parameter TPP may include various control patterns such as the number of times that a command is repeatedly applied, a latency between commands, and adjustment of a refresh period.

FIG. 6 is a block diagram illustrating a method in which a host device generates the test pattern TP, according to an example embodiment of the inventive concepts.

Referring to FIG. 6, the host device 1100 may include a central processing unit (hereinafter referred to as a "CPU") 1110, the test pattern generator 1120, and a memory controller 1130.

The CPU 1110 may be implemented using processing circuitry such as hardware including logic circuits, a hardware/software combination such as a processor executing software; or a combination thereof. For example, while the processing circuitry is illustrated as being a CPU, the processing circuitry may include, but is not limited to, a CPU, an arithmetic logic unit (ALU), a digital signal processor, a microcomputer, a field programmable gate array (FPGA), a System-on-Chip (SoC) a programmable logic unit, a microprocessor, or an application-specific integrated circuit (ASIC), etc. The processing circuitry may be configured as a special purpose computer to execute a BIOS boot program to control the test pattern generator 1120 and the memory controller 1130. The processing circuitry may improve the functioning of the computer system 1000 itself by constructing a test environment customized (or, alternatively, optimized) for the memory module 1200, and reducing reduce an unnecessary test procedure performed on same.

For example, when the computer system 1000 is booted up, the CPU 1110 controls the test pattern generator 1120 and the memory controller 1130 under control of the BIOS. When the test pattern parameter TPP stored in the test pattern memory 1250 (refer to FIG. 1) of the memory module 1200 is read, the test pattern generator 1120 generates the test pattern TP in compliance with a given policy. Under control of the CPU 1110, the memory controller 1130 may generate a command, data, an address, etc. corresponding to the test pattern TP and may transfer the command, the data, and the address to the memory module 1200.

The generation of the test pattern TP and the execution of the test operation are not limited to a time when the computer system 1000 is booted up. Even in the case where the computer system 1000 is being driven by the operating system OS, under control of the operating system OS, the test pattern TP is able to be generated, and the test operation is able to be performed. For example, the test pattern parameter TPP stored in the test pattern memory 1250 of the memory module 1200 may be read under control of an application program or the operating system OS. The test pattern generator 1120 may generate the test pattern TP based on the read test pattern parameter TPP. Under control of the CPU 1110, the memory controller 1130 may generate a command, data, an address, etc. corresponding to the test pattern TP and may transfer the command, the data, and the address to the memory module 1200. In this case, the test operation may be performed on a memory area, onto which data are not loaded, from among memory areas of the memory module 1200.

Figure 7:
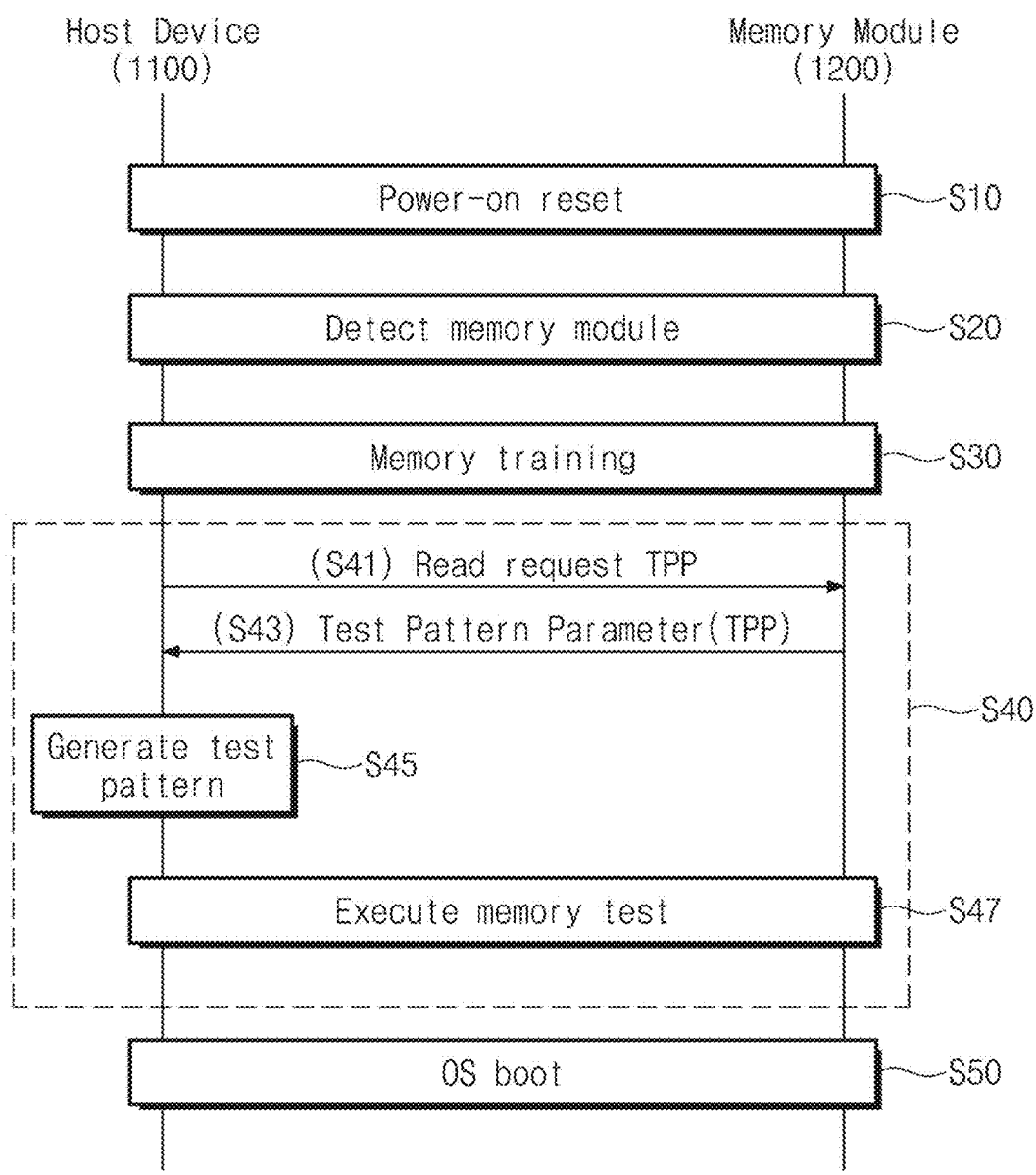
FIG. 7 is a diagram briefly illustrating a test procedure of the inventive concepts, which is performed at a BIOS level.

FIG. 7 is a diagram briefly illustrating a test procedure of the inventive concepts, which is performed at a BIOS level.

Referring to FIG. 7, in a booting phase of the computer system 1000, the memory module 1200 may provide the host device 1100 with the test pattern parameter TPP to which a weak characteristic is applied.

In operation S10, a booting procedure is initiated as a power is supplied to the computer system 1000 or the host device 1100 (power-on). Alternatively, a rebooting operation may be automatically performed due to a system error occurring in a previous operation. When a power is supplied to the computer system 1000, the CPU 1110 may initialize a program counter PC. As the program counter PC is initialized, an address to be first accessed by the CPU 1110 may be set to an address value of a boot program of the BIOS.

In operation S20, as the boot program is executed, the host device 1100 detects the existence of the memory module 1200 for the purpose of performing a power-on self-test (POST) operation. In the POST operation, the host device 1100 may test whether the CPU 1110, the memory module 1200, an auxiliary (or secondary) storage device, and the like are normally driven. A memory module test operation of the inventive concepts is performed as a portion of the POST operation.

In operation S30 a training operation may be performed on the memory module 1200. Through the training operation, the host device 1100 may improve the reliability of data or signal exchange with the memory module 1200. For example, the host device 1100 may determine a desired (or, alternatively, an optimum) clock timing or level of a reference voltage by writing and reading training data in and from the memory module 1200 under various conditions. The training operation of the memory module 1200 may be performed after a test procedure to be described later is terminated.

In operation S40, a test operation is performed on the memory module 1200 of the inventive concepts. Operation S40 corresponding to the test procedure associated with the memory module 1200 may include operation S41, operation S43, operation S45, and operation S47.

In operation S41, the host device 1100 requests the test pattern parameter TPP from the memory module 1200 as the boot program is executed. In operation S43, the memory module 1200 may transfer the test pattern parameter TPP stored in the test pattern memory 1250 to the host device 1100. In operation S45, the test pattern parameter TPP is provided to the test pattern generator 1120. The test pattern generator 1120 may generate the test pattern TP corresponding to the test pattern parameter TPP in compliance with a given policy. In operation S47, the host device 1100 may generate a command, an address, and data corresponding to the generated test pattern TP to perform a test operation on the memory module 1200.

When the test operation associated with the memory module 1200 is terminated, in operation S50, the operating system OS is loaded onto the memory module 1200 provided as a main memory. As the operating system OS is loaded, the operating system OS may have the overall control authority of a system.

The test procedure of the memory module 1200 performed at the BIOS level when the computer system 1000 is booted up is briefly described above. In the booting phase, because the memory module 1200 is in a state where data are not loaded thereon, it is free to apply a test pattern. Accordingly, there is almost no limitation on the application of the test pattern TP.

Figure 8:
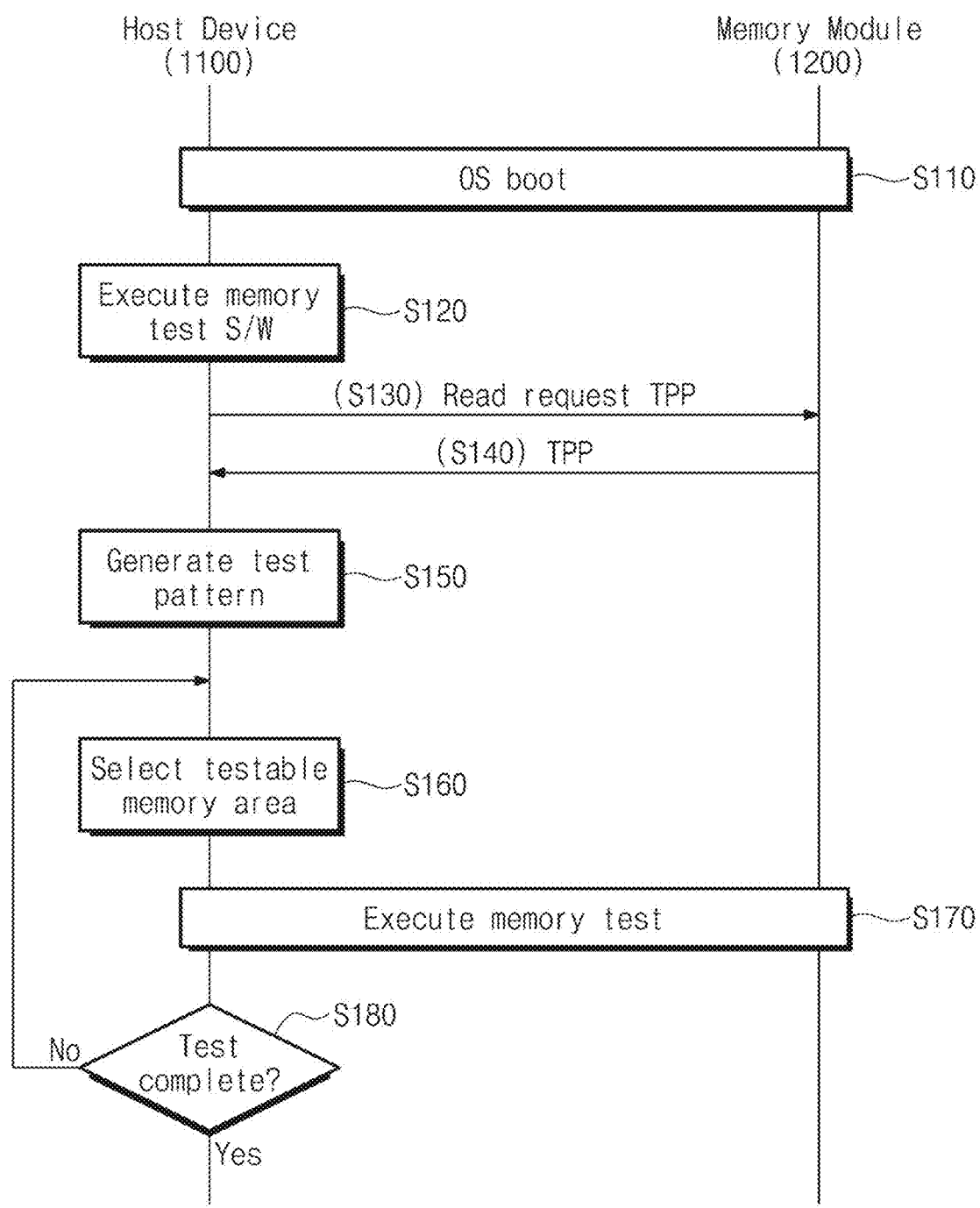
FIG. 8 is a diagram briefly illustrating a test procedure, which is performed at a BIOS level, according to another example embodiment of the inventive concepts.

FIG. 8 is a diagram briefly illustrating a test procedure, which is performed at a BIOS level, according to another example embodiment of the inventive concepts.

Referring to FIG. 8, the computer system 1000 may perform a memory test operation in consideration of a weak characteristic of the memory module 1200 even in the case where an operation is being performed under control of the operating system OS. Under the operating system OS or an application program for a test operation of the inventive concepts, the memory module 1200 may provide the host device 1100 with the test pattern parameter TPP to which a weak characteristic is applied.

In operation S110, the booting of the computer system 1000 may be completed, and the memory module 1200 may be in a state where the operating system OS and data are loaded onto a partial area thereof.

In operation S120, test software (S/W) for the memory test according to an example embodiment of the inventive concepts may be executed.

In operation S130, the host device 1100 requests the test pattern parameter TPP from the memory module 1200 in compliance with a procedure defined in the test software.

In operation S140, the memory module 1200 may transfer the test pattern parameter TPP stored in the test pattern memory 1250 to the host device 1100.

In operation S150, the test pattern parameter TPP is provided to the test pattern generator 1120. The test pattern generator 1120 may generate the test pattern TP corresponding to the test pattern parameter TPP in compliance with a given policy.

In operation S160, the host device 1100 selects a memory area testable from among memory areas of the memory module 1200. For example, a bank-unit or chip-unit area corresponding to a free area where data are not loaded may be selected for the test operation. The host device 1100 may determine which bank-unit or chip-unit area correspond to the free area by reading data from the memory module 1200.

In operation S170, the host device 1100 may generate a command, an address, and data corresponding to the generated test pattern TP to perform a test operation on the selected area. The stress test way described with reference to FIG. 4, a way to repeatedly write the same data, or a way to change a latency between certain commands may be applied to the memory test.

In operation S180, the host device 1100 determines whether the test operation is completed. When there is no memory area selectable for the test operation (Yes), the memory test procedure may be terminated. In contrast, when there is a memory area selectable for the test operation (No), the procedure returns to operation S160 to select a new memory area for the test operation.

Examples of the memory test performed at the BIOS level and the operating system (OS) level are briefly described with reference to FIGS. 7 and 8.

Figure 9:
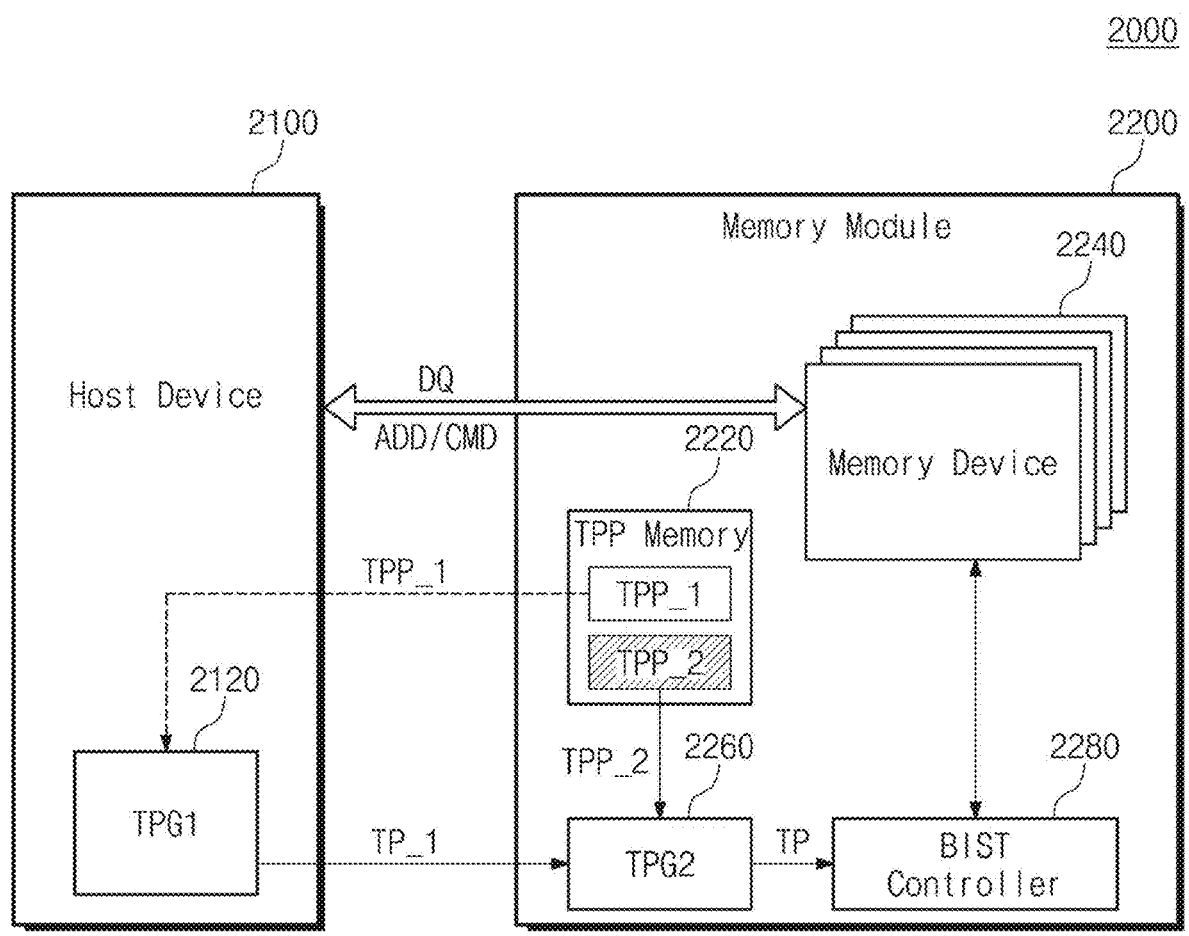
FIG. 9 is a block diagram illustrating a computer system including a memory module according to another example embodiment of the inventive concepts.

FIG. 9 is a block diagram illustrating a computer system including a memory module according to another example embodiment of the inventive concepts.

Referring to FIG. 9, a computer system 2000 may include a host device 2100 and a memory module 2200 having a built-in self-test (BIST) function.

As in the host device 1100, the host device 2100 may perform various arithmetic/logical operations for the purpose of controlling overall operations of the computer system 2000. The host device 2100 may include a first test pattern generator 2120. The first test pattern generator 2120 generates a first test pattern TP_1 by using a first test pattern parameter TPP_1 provided from the memory module 2200. The first test pattern TP_1 may be defined as a command, an address, and a data set for various test operations to be performed on the memory module 2200. In another example embodiment, the first test pattern TP_1 may be provided to the memory module 2200 as pattern information, not a command, an address, or a data set.

The memory module 2200 may include a test pattern memory 2220, a plurality of memory devices 2240, a second test pattern generator 2260, and a BIST controller 2280. The plurality of memory devices 2240 are the same as those described with reference to FIG. 1, and thus, additional description will be omitted to avoid redundancy.

In particular, the first and second test pattern parameters TPP_1 and TPP_2 associated with the memory module 2200 are stored in the test pattern memory 2220. The first test pattern parameter TPP_1 is provided to the host device 2100 in a test operation. In contrast, the second test pattern parameter TPP_2 is provided to the second test pattern generator 2260 provided in the memory module 2200. The first test pattern parameter TPP_1 may be, for example, a parameter for a general test operation to be performed regardless of a characteristic of the memory module 2200. In contrast, the second test pattern parameter TPP_2 may be a parameter including weak characteristic information for each generation, for each capacity, and for each kind of the memory module 2200. The second test pattern parameter TPP_2 may be information including weak characteristics for each manufactured time of the memory module 2200, for each capacity of the memory module 2200, and for each kind of the memory module 2200.

In example embodiments, the memory module 2200 itself may include processing circuitry such as hardware including logic circuits, a hardware/software combination such as a processor executing software; or a combination thereof. For example, the processing circuitry may include, but is not limited to, a CPU, an arithmetic logic unit (ALU), a digital signal processor, a microcomputer, a field programmable gate array (FPGA), a System-on-Chip (SoC) a programmable logic unit, a microprocessor, or an application-specific integrated circuit (ASIC), etc. The processing circuitry may be configured as a special purpose computer to execute a BIOS boot program to perform the functions of the second test pattern generator 2260 and the BIST controller 2280.

The second test pattern generator 2260 may generate the test pattern TP by using the second test pattern parameter TPP_2. Alternatively, the second test pattern generator 2260 may generate the test pattern TP by combining the first test pattern TP_1 provided from the host device 2100 and the second test pattern TP_2 generated by using the second test pattern parameter TPP_2. The test pattern TP generated from the second test pattern generator 2260 is provided to the BIST controller 2280.

The BIST controller 2280 performs a test operation on the memory devices 2240 by using the test pattern TP generated from the second test pattern generator 2260. For example, the BIST controller 2280 may generate a command, an address, and data for testing the plurality of memory devices 2240 with reference to the test pattern TP. A test result of the BIST controller 2280 may be transferred to the host device 2100 or may be stored in internal storage.

In an example embodiment, weak characteristic information associated with the memory module 2200 may be restricted from being transferred to the host device 2100. Accordingly, security of the characteristic information of the memory module 2200 may be reinforced by limiting distribution of the weak characteristic information to within the memory module 2200 itself.

Figure 10:
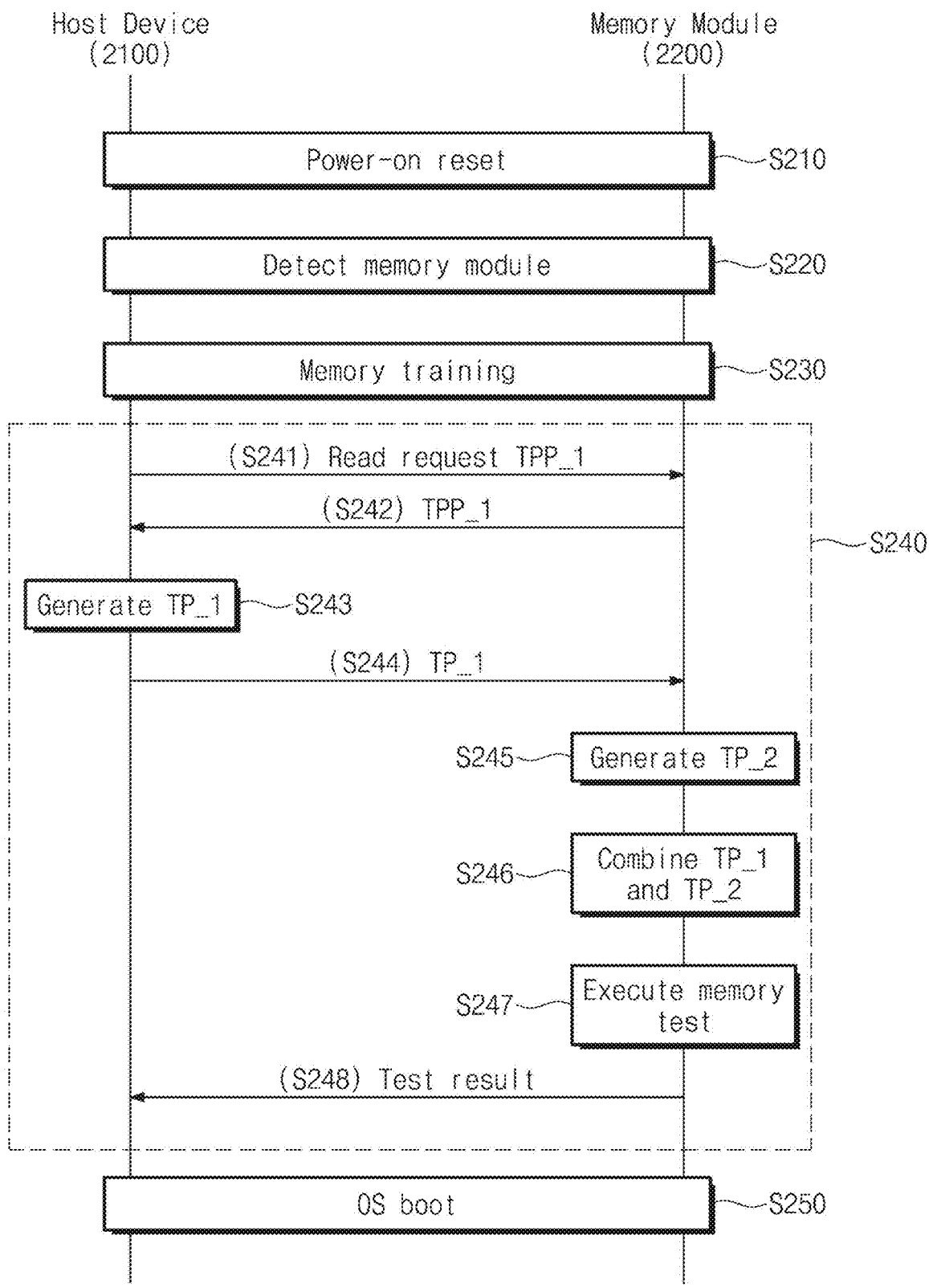
FIG. 10 is a diagram briefly illustrating a test procedure performed at a BIOS level of a computer system of FIG. 9.

FIG. 10 is a diagram briefly illustrating a test procedure performed at a BIOS level of a computer system of FIG. 9.

Referring to FIG. 10, in a booting phase of the computer system 2000, the memory module 2200 may provide the host device 2100 with the first test pattern parameter TPP_1 not including information about a weak characteristic to the host device 2100.

In operation S210, a booting procedure is initiated as a power is supplied to the computer system 2000 or the host device 2100 (power-on). When a power is supplied to the computer system 2000, a CPU may initialize a program counter PC. As the program counter PC is initialized, an address to be first accessed by the CPU may be set to an address value of a boot program of the BIOS.

In operation S220, as the boot program is executed, the host device 2100 detects the existence of the memory module 2200.

In operation S230 a training operation may be performed on the memory module 2200. Through the training operation, the host device 2100 may improve the reliability of data or signal exchange with the memory module 2200. For example, the host device 2100 may determine a desired (or, alternatively, an optimum) clock timing or level of a reference voltage by writing and reading training data in and from the memory module 2200 under various conditions. The training operation of the memory module 2200 may be performed after a test procedure to be described later is terminated.

In operation S240, a test operation is performed on the memory module 2200 of the inventive concepts. Operation S240 corresponding to the test procedure associated with the memory module 2200 may include operation S241 to operation S248.

In operation S241, the host device 2100 requests the first test pattern parameter TPP_1 from the memory module 2200 as the boot program is executed. In operation S242, the memory module 2200 may transfer the first test pattern parameter TPP_1 stored in the test pattern memory 2220 to the host device 21001 not including information about a weak characteristic to the host device 2100. In operation S243, the first test pattern parameter TPP_1 is provided to the first test pattern generator 2120. The first test pattern generator 2120 processes the first test pattern parameter TPP_1 to generate the first test pattern TP_1. In operation S244, the host device 2100 may transfer the first test pattern TP_1 thus generated to the memory module 2200.

In operation S245, the second test pattern generator 2260 of the memory module 2200 generate the second test pattern TP_2 from the second test pattern parameter TPP_21 including information about a weak characteristic to the host device 2100. In operation S246, the second test pattern generator 2260 generate the test pattern TP by combining the second test pattern TP_2 thus generated and the first test pattern TP_1 provided from the host device 2100. In operation S247, the BIST controller 2280 may test the memory devices 2240 by using the test pattern TP thus generated. In operation S248, a test result may be transferred to the host device 2100.

In operation S250, when the operating system OS is loaded onto the memory module 2200 where the test operation is completed, the overall booting procedure may be completed.

Figure 11:
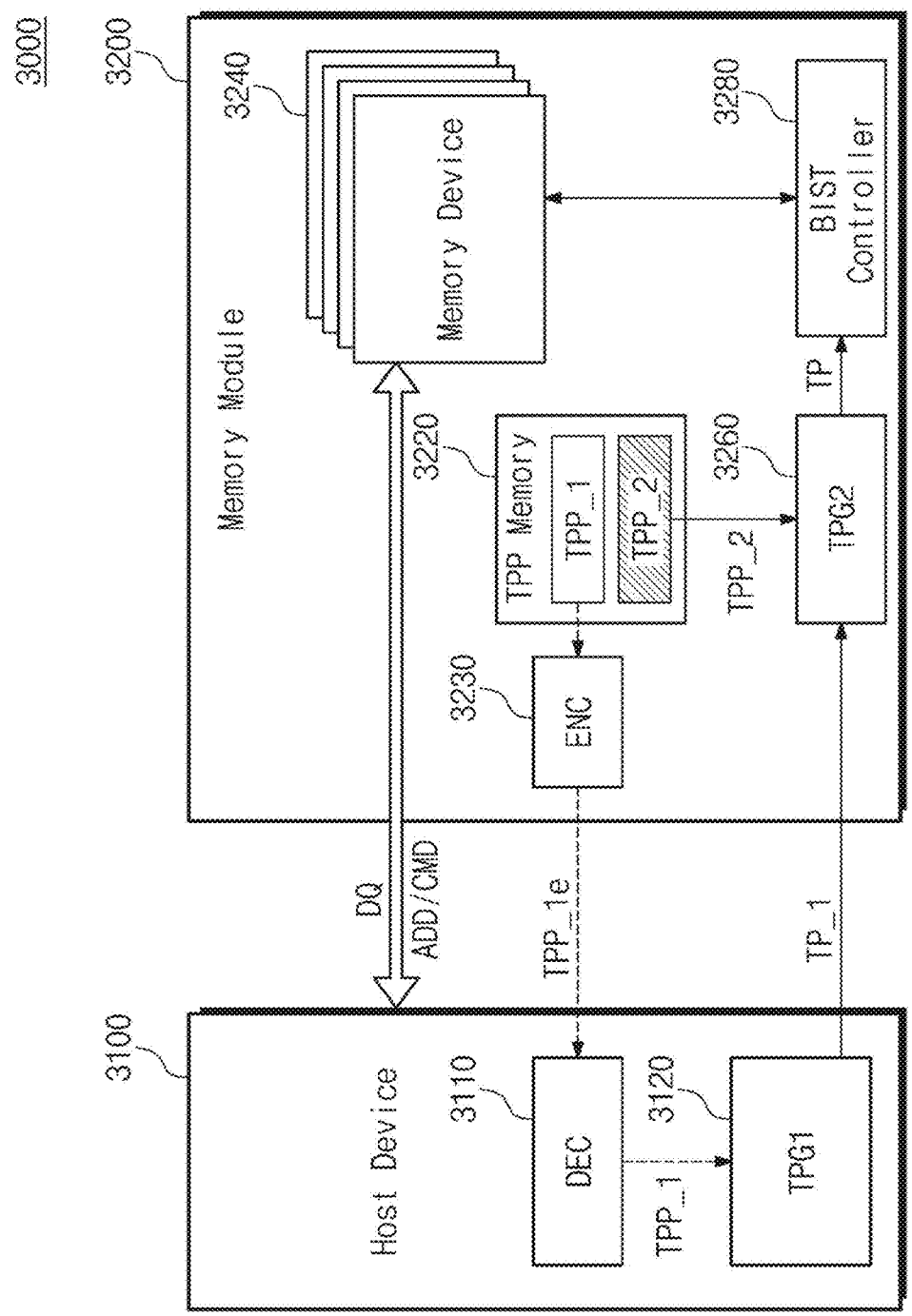
FIG. 11 is a block diagram illustrating another example embodiment of a computer system of FIG. 9.

FIG. 11 is a block diagram illustrating a computer system according to another example embodiment of the inventive concepts.

Referring to FIG. 11, a computer system 3000 may include a host device 3100 and a memory module 3200 having a built-in self-test (BIST) function. The memory module 3200 transfers an encoded test pattern parameter TPP_e to the host device 3100.

The host device 3100 may include first processing circuitry and memory module 3200 may include second processing circuitry, each of the first and second processing circuitry may be implemented using processing circuitry such as hardware including logic circuits, a hardware/software combination such as a processor executing software; or a combination thereof. The processing circuitry of the host device 3100 may be configured as a special purpose computer to execute a BIOS boot program to control a decoder 3110 and a first test pattern generator 3120, and the processing circuitry of the memory module 3200 may be configured as a special purpose computer to control an encoder 3230, a second test pattern generator 3260 and a BIST controller 3280.

For example, the decoder 3110 of the host device 3110 may decode the encoded test pattern parameter TPP_1e provided from the memory module 3200 to restore the first test pattern parameter TPP_1. The first test pattern generator 3120 generates the first test pattern TP_1 by using the first test pattern parameter TPP_1. The first test pattern TP_1 may be again transferred to the memory module 3200.

The memory module 3200 may include the test pattern memory 3220, the encoder 3230, a plurality of memory devices 3240, a second test pattern generator 3260, and the BIST controller 3280. The test pattern memory 3220, the plurality of memory devices 3240, the second test pattern generator 3260, and the BIST controller 3280 are substantially the same as those of FIG. 9, and thus, additional description will be omitted to avoid redundancy.

The encoder 3230 encodes the first test pattern parameter TPP_1 stored in the test pattern memory 3220 in compliance with a given security coding manner. The first test pattern parameter TPP_1 encoded by the encoder 3230 may be transferred to the host device 3100. Even though the first test pattern parameter TPP1_e is leaked out by an attack such as a side channel attack, because the first test pattern parameter TPP1_e is in an encoded state, minimum security may be guaranteed. Accordingly, the leakage of the weak characteristic information of the memory module 3200 may be blocked by encoding the first test pattern parameter TPP_1.

Figure 12:
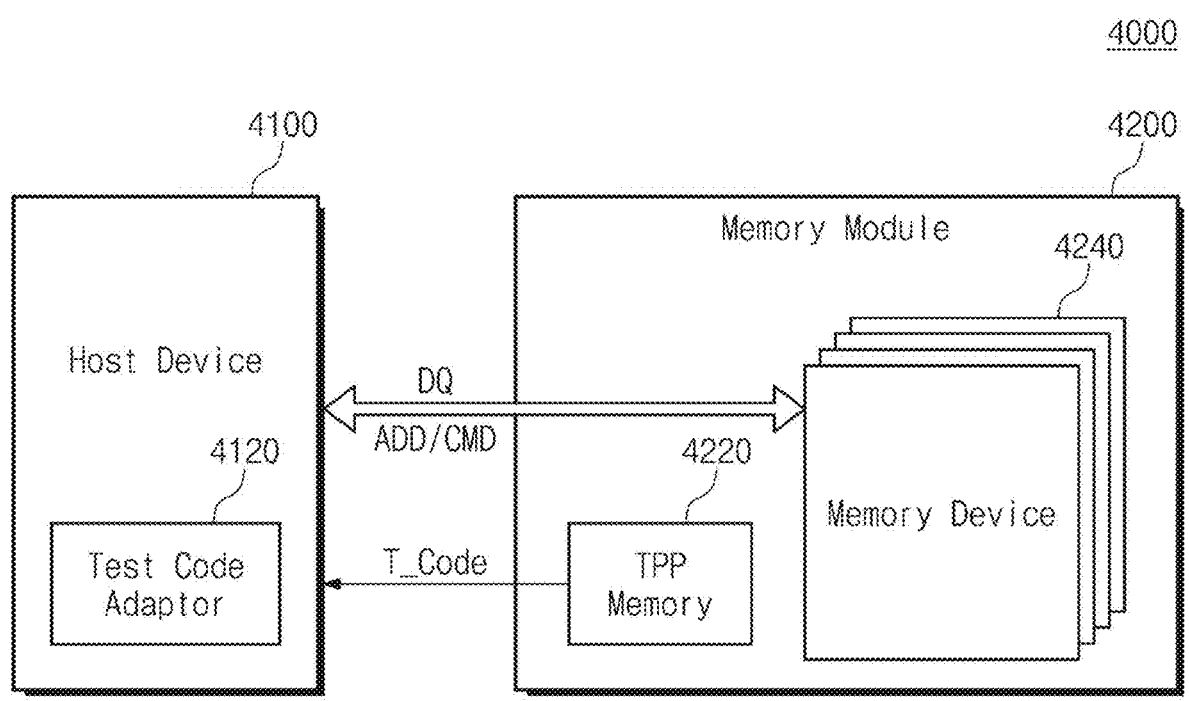
FIG. 12 is a block diagram illustrating a computer system according to another example embodiment of the inventive concepts.

FIG. 12 is a block diagram illustrating a computer system according to another example embodiment of the inventive concepts. Referring to FIG. 12, a computer system 4000 may include a host device 4100 and a memory module 4200.

The host device 4100 may perform various arithmetic/logical operations for the purpose of controlling overall operations of the computer system 4000. In particular, the host device 4100 may include a test code adaptor 4120. The test code adaptor 4120 may generate the test pattern TP by using a test code T_Code provided from the memory module 4200. The test pattern TP may be defined as a command, an address, and a data set for various test operations to be performed on the memory module 4200.

The test code adaptor 4120 generates a test pattern by using the test code T_Code to which a weak characteristic of the memory module 4200 is applied. Even though the test code T_Code is provided, a portion to be adjusted depending on a system environment or condition of the host device 4100 may exist. The test code adaptor 4120 includes a code modifying function for customizing (or, alternatively, optimizing) the test code T_Code provided from the memory module 4200 with regard to the system environment or condition. As the modified test code T_Code is executed, the test pattern TP for testing the memory module 4200 may be generated.

In this case, the host device 4100 may test the memory module 4200 by using the test pattern TP thus generated. The memory module 4200 may be tested at a BIOS level or an operating system (OS) level of the host device 4100.

The memory module 4200 is provided as a main memory for an operation of the computer system 4000. The memory module 4200 includes a test code memory 4220 including a nonvolatile memory element and a plurality of memory devices 4240. The test code memory 4220 stores the test code T_Code to which a weak characteristic of the memory module 4200 is applied.

Here, the test code T_Code stored in the test code memory 4220 may be a code that is designed to perform a test operation in consideration of characteristic information for each generation, for each capacity, and for each kind of the memory module 4200. The test code T_Code may be designed by a standard programming language (e.g., C language) in consideration weak characteristics collected in the process of manufacturing the memory module 4200. The designed test code T_Code may be programmed in the test code memory 4220 implemented with a nonvolatile memory.

Figure 13:
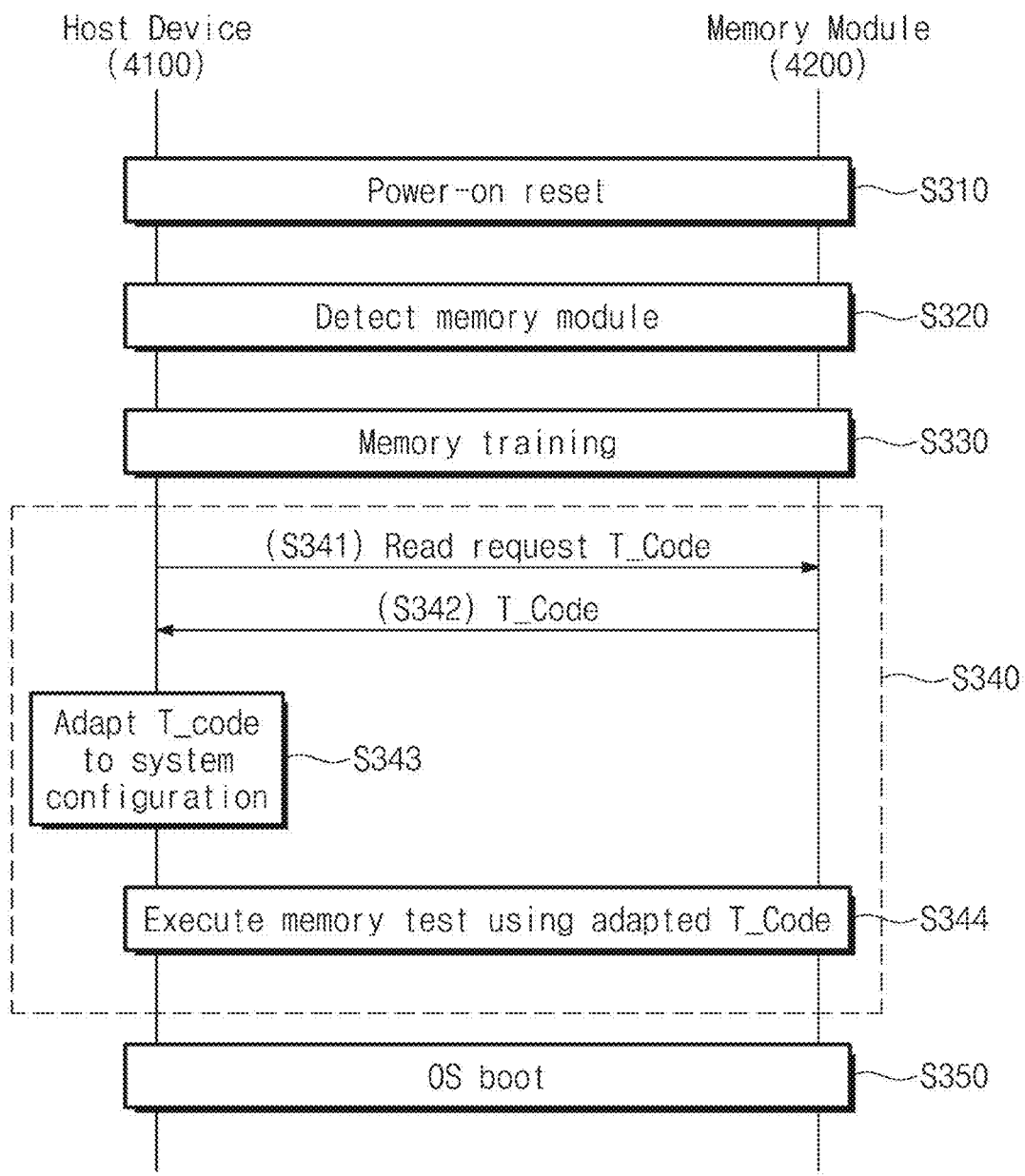
FIG. 13 is a diagram briefly illustrating a test procedure performed in a computer system of FIG. 12.

FIG. 13 is a diagram briefly illustrating a test procedure performed in a computer system of FIG. 12. Referring to FIG. 13, in a booting phase of the computer system 4000, the memory module 4200 may provide the host device 4100 with the test code T_Code including information about a weak characteristic.

In operation S310, a booting procedure is initiated as a power is supplied to the computer system 4000 or the host device 4100 (power-on). When a power is supplied to the computer system 4000, a CPU may initialize a program counter PC. As the program counter PC is initialized, an address to be first accessed by the CPU may be set to an address value of a boot program of the BIOS.

In operation S320, as the boot program is executed, the host device 4100 detects the existence of the memory module 4200 for the purpose of performing a power-on self-test (POST) operation. A memory module test operation of the inventive concepts is performed as a portion of the POST operation.

In operation S330 a training operation may be performed on the memory module 4200. Through the training operation, the host device 4100 may improve the reliability of data or signal exchange with the memory device 4200. For example, the host device 4100 may determine a desired (or, alternatively, optimum) clock timing or level of a reference voltage by writing and reading training data in and from the memory module 4200 under various conditions. The training operation of the memory module 4200 may be performed after a test procedure to be described later is terminated.

In operation S340, a test operation is performed on the memory module 4200 of the inventive concepts. Operation S340 corresponding to the test procedure associated with the memory module 4200 may include operation S341 to operation S344.

In operation S341, the host device 4100 requests the test code T_Code from the memory module 4200 as the boot program is executed. In operation S342, the memory module 4200 may transfer the test code T_Code stored in the test code memory 4220 to the host device 4100. In operation S343, the test code adaptor 4120 of the host device 4100 may modify the test code T_Code so as to be appropriate to drive BIOS firmware. In operation S344, the host device 4100 may execute the modified test code T_Code to perform the memory test. In operation S350, the operating system OS may be loaded onto the memory module 4200 where the test operation is completed, and the booting procedure may be completed.

According to an example embodiment of the inventive concepts, a test pattern may be generated based on a weak characteristic for each generation, for each capacity, and for each kind of a DRAM, and a defect may be detected and solved by using the test pattern.

While the inventive concepts have been described with reference to some example embodiments thereof, it will be apparent to those of ordinary skill in the art that various changes and modifications may be made thereto without departing from the spirit and scope of the inventive concepts as set forth in the following claims.

What is claimed is:

1. A memory module comprising:
at least one semiconductor memory device; and
a test pattern memory configured to,
    store first test pattern information for testing the at least one semiconductor memory device, and
    transfer the first test pattern information to a host to perform a test operation on the memory module based on the test pattern.

2. The memory module of claim 1, wherein the test pattern memory corresponds to one of a serial component recognition device (SPD) and a register clock driver (RCD) mounted on the memory module.

3. The memory module of claim 1, wherein the at least one semiconductor memory device is configured to have the test operation performed thereon in a booting operation of the host by a Basic Input Output System BIOS of the host.

4. The memory module of claim 3, wherein the first test pattern information corresponds to a parameter for generating a test pattern used in the test operation.

5. The memory module of claim 4, wherein the memory module is configured to receive the test pattern generated by the host.

6. The memory module of claim 3, wherein the first test pattern information corresponds to a code utilized to perform the test operation.

7. The memory module of claim 1, further comprising:
processing circuitry configured to generate a first test pattern based on second test pattern information stored in the test pattern memory, the first test pattern for testing the at least one semiconductor memory device.

8. The memory module of claim 7, wherein the processing circuitry is configured to test the at least one semiconductor memory device based on the first test pattern generated internally by the memory module based on one or more of the second test pattern information or a second test pattern generated by the host based on the first test pattern information.

9. The memory module of claim 1, further comprising:
processing circuitry configured as an encoder to,
    encode the first test pattern information to generate an encoded first test pattern information, and
    transfer the encoded first test pattern information to the host.

10. A method of testing a memory module, the method comprising:
reading a test pattern parameter stored in the memory module;
generating a test pattern based on the test pattern parameter read from the memory module; and
testing the memory module based on the test pattern.

11. The method of claim 10, wherein the memory module includes a test pattern memory, the test pattern memory being a nonvolatile memory configured to store the test pattern parameter.

12. The method of claim 11, wherein the test pattern parameter includes test attributes set according to a characteristic of at least one of a generation, a capacity, and a kind of the memory module.

13. The method of claim 11, wherein a capacity of the test pattern memory is between hundreds of bytes to hundreds of megabytes.

14. The method of claim 11, wherein the test pattern memory corresponds to at least one of a serial component recognition device (SPD) and a register clock driver (RCD) mounted on the memory module.

15. The method of claim 10, further comprising:
performing, by the memory module, security encoding on the read test pattern parameter to generate a security-encoded test pattern parameter;
transferring the security-encoded test pattern parameter from the memory module to a host device; and
performing, at the host device, security decoding on the security-encoded test pattern parameter.

16. The method of claim 10, further comprising:
selecting a memory area of the memory module in which data are not loaded, wherein
the testing tests the memory area of the memory module based on the test pattern.

17. A computer system comprising:
a memory module including at least one semiconductor memory device and a test pattern memory, the test pattern memory configured to store a test pattern parameter including weak characteristic information associated with the at least one semiconductor memory device; and
a host device configured to generate a test pattern based on the test pattern parameter read from the memory module, the test pattern for testing the memory module.

18. The computer system of claim 17, wherein the host device includes first processing circuitry configured to generate the test pattern by processing the test pattern parameter in compliance with a given policy.

19. The computer system of claim 18, wherein
the memory module further includes second processing circuitry configured as an encoder to encode the test pattern parameter to generate an encoded test pattern parameter, wherein
the first processing circuitry is further configured as a decoder to decode the encoded test pattern parameter to generate a decoded test pattern parameter, and to generate the test pattern based on the decoded test pattern parameter.

20. The computer system of claim 17, wherein the memory module further includes: processing circuitry configured to, generate another test pattern based on the test pattern parameter; and test the at least one semiconductor memory device based on one or more of the test pattern or the another test pattern.

* * * * *